United States Patent
Sicard

(10) Patent No.: US 9,595,954 B2
(45) Date of Patent: Mar. 14, 2017

(54) METHOD AND CIRCUIT FOR RECHARGING A BOOTSTRAP CAPACITOR USING A TRANSFER CAPACITOR

(71) Applicant: Thierry Sicard, Austin, TX (US)

(72) Inventor: Thierry Sicard, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/536,912

(22) Filed: Nov. 10, 2014

(65) Prior Publication Data

US 2016/0134279 A1    May 12, 2016

(51) Int. Cl.
| | | |
|---|---|---|
| H03K 3/00 | (2006.01) | |
| H03K 17/687 | (2006.01) | |
| H03K 17/16 | (2006.01) | |

(52) U.S. Cl.
CPC ......... *H03K 17/687* (2013.01); *H03K 17/165* (2013.01); *H03K 17/168* (2013.01)

(58) Field of Classification Search
USPC ......................................................... 327/109
See application file for complete search history.

(56) References Cited

U.S. PATENT DOCUMENTS

| | | | | |
|---|---|---|---|---|
| 4,704,721 A | * | 11/1987 | Barr .................... | H04L 25/4904 327/231 |
| 8,558,586 B1 | * | 10/2013 | Martin ................. | G11C 7/1057 327/108 |
| 2005/0116748 A1 | * | 6/2005 | Deppe .................. | H02M 1/08 327/112 |
| 2013/0119965 A1 | * | 5/2013 | Marvin ................. | H02M 7/538 323/312 |
| 2013/0214747 A1 | | 8/2013 | Kobayashi | |
| 2013/0214757 A1 | | 8/2013 | Lee | |

FOREIGN PATENT DOCUMENTS

| | | |
|---|---|---|
| CN | 202798435 | 3/2013 |
| EP | 0973250 A2 | 1/2000 |

OTHER PUBLICATIONS

IXYS Integrated Circuits Division, "IX21844 High Voltage Half-Bridge Gate Driver," Specification: DS-IX21844-R01; Dec. 10, 2013; downloaded from <<www.ixysic.com/home/pdfs.nsf/www/IX21844.pdf/$file/IX21844.pdf>> on Nov. 10, 2014, 14 pages.

Pathak, Abhijit D., "MOSFET/IGBT Drivers Theory and Applications," Section 3.1; doc IXAN0010; 2001 IXYS Corporation; downloaded from <<www.ixys.com/Documents/AppNotes/IXAN0010.pdf>> on Nov. 10, 2014, 26 pages.

\* cited by examiner

*Primary Examiner* — Lincoln Donovan
*Assistant Examiner* — Patrick Chen

(57) ABSTRACT

A circuit including and a method utilizing an improved bootstrap topology provide power to a high side (HS) driver for high efficiency applications. The improved bootstrap topology includes a transfer capacitor to store charge and to recharge a bootstrap capacitor, which provides power to the HS driver. The improved bootstrap topology also includes a resistor connected to the transfer capacitor to charge the transfer capacitor from a voltage source and to isolate the transfer capacitor from high voltage pulses.

10 Claims, 3 Drawing Sheets

METHOD AND CIRCUIT FOR RECHARGING A BOOTSTRAP CAPACITOR USING A TRANSFER CAPACITOR

BACKGROUND

Field of the Disclosure

The present disclosure relates generally to electronic devices and methods, and more particularly, to electronic devices including power transistor driver circuits and methods.

Background of the Disclosure

A typical power transistor circuit operates with such high currents and high switching speeds that even small parasitic characteristics, such as parasitic inductance of interconnects, can result in undesirably high voltages. Such undesirably high voltages require devices be rated for high voltages, which can increase their cost and complexity, complicate their manufacture, and impair their performance.

A bootstrap topology is portion of a circuit for use in a power transistor circuit having a high side (HS) transistor connected to a higher voltage in addition to a low side (LS) transistor connected to a lower voltage. While the LS transistor can be driven conventionally because of its lower voltage, the bootstrap topology is needed to drive the HS transistor at a voltage compatible with the higher voltage of the HS transistor. Attempting to provide a bootstrap topology to supply the high side (HS) driver of a high efficiency system has heretofore been problematic because high efficiency systems switch rapidly, so the high rate of change of current per unit time (dI/dt) multiplied by any inductance in series with a low side transistor (e.g., bonding wire inductance, lead inductance, printed circuit board (PCB) trace inductance, etc.) can result in a large negative voltage pulse at the load output of the circuit, with the consequent disadvantages described above. Also, command of a bootstrap transistor is difficult to manage because that transistor should not be turned on during the negative voltage pulse, as doing so would create a short circuit between a source voltage and a HS driver bootstrap capacitor.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A circuit including and a method utilizing an improved bootstrap topology provides power to a high side (HS) driver for high efficiency applications. The improved bootstrap topology includes a transfer capacitor to store charge and to recharge a bootstrap capacitor, which provides power to the HS driver. The improved bootstrap topology also includes a resistor connected to the transfer capacitor to charge the transfer capacitor from a voltage source and to isolate the transfer capacitor from high voltage pulses.

Figure 1:
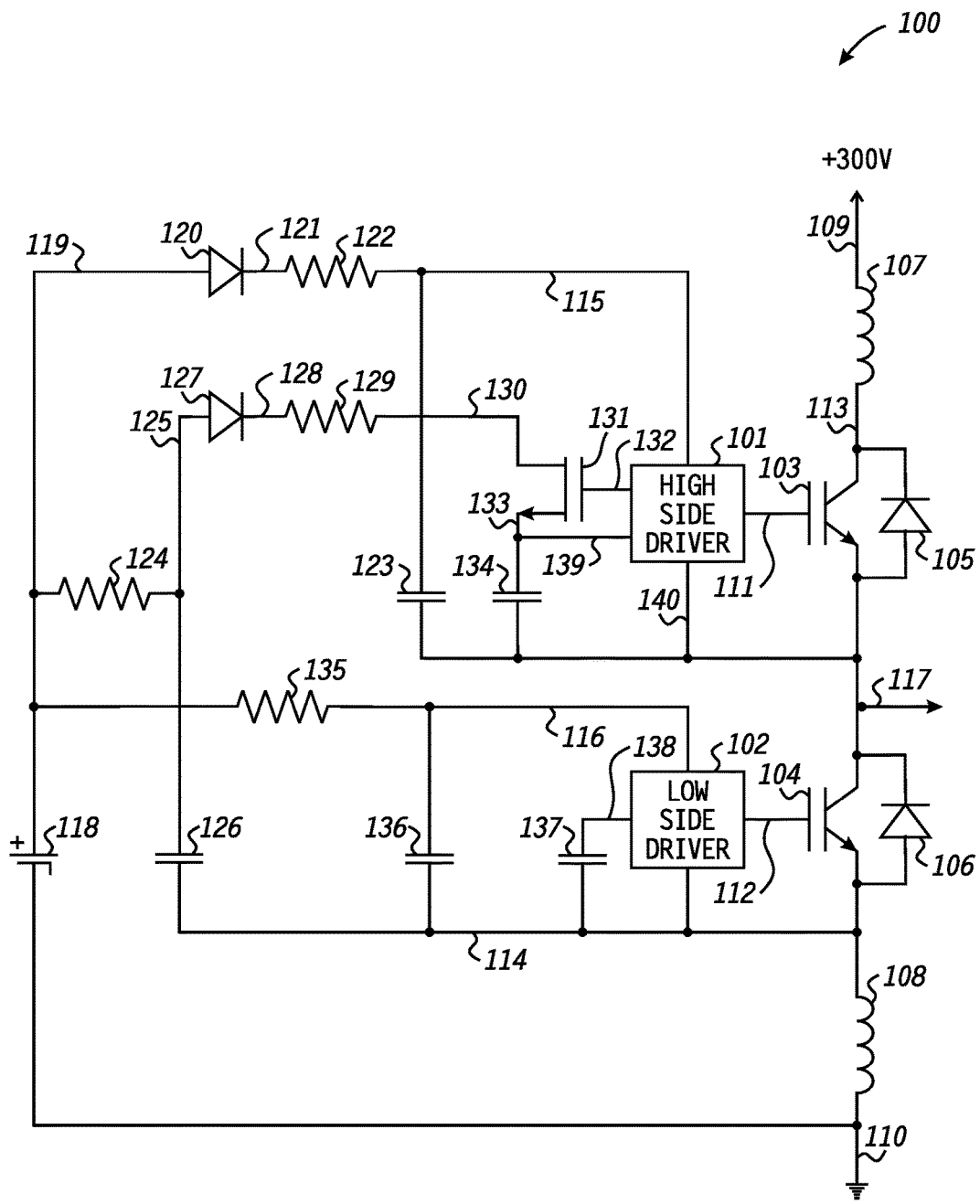
FIG. 1 is a schematic diagram illustrating a circuit in accordance with at least one embodiment.

FIG. 1 is a schematic diagram illustrating a circuit in accordance with at least one embodiment. The circuit 100 includes a high side driver 101, a low side driver 102, a high side transistor 103, a low side transistor 104, a high side reverse biased diode 105, a low side reverse biased diode 106, a high side parasitic inductance 107, a low side parasitic inductance 108, a output terminal 117, a voltage source 118, a diode 120, a resistor 122, a capacitor 123, a resistor 124, a transfer capacitor 126, a resistor 129, a bootstrap transistor 131, a bootstrap capacitor 134, a resistor 135, a capacitor 136, and a capacitor 137.

A positive terminal of voltage source 118 provides a voltage, for example, +35V, at node 119 to supply power to a high side power input 116 of low side driver 102 via resistor 135. A first terminal of resistor 135 is connected to node 119. A second terminal of resistor 135 is connected to high side power input 116 of low side driver 102. A first terminal of capacitor 136 is connected to high side power input 116 of low side driver 102. A second terminal of capacitor 136 is connected to low side power input 114 of low side driver 102. A first terminal of capacitor 137 is connected to an input 138 of low side driver 102. A second terminal of capacitor 137 is connected to low side power input 114 of low side driver 102. An output 112 of low side driver 102 is connected to an input of low side transistor 104, which may be, for example, a gate terminal of an insulated gate bipolar transistor (IGBT).

The positive terminal of voltage source 118 at node 119 is connected to an anode terminal of diode 120. A cathode terminal of diode 120 is connected to node 121. Node 121 is connected to a first terminal of resistor 122. A second terminal of resistor 122 is connected to high side power input 115 of high side driver 101. A first terminal of capacitor 123 is connected to high side power input 115 of high side driver 101. A second terminal of capacitor 123 is connected to a low side power input of high side driver 101 at output terminal 117. An output 111 of high side driver 101 is connected to an input of high side transistor 103, which may be, for example, a gate terminal of an IGBT.

The positive terminal of voltage source 118 at node 119 is connected to a first terminal of resistor 124. A second terminal of resistor 124 is connected at node 125 to an anode terminal of diode 127 and to a first terminal of transfer capacitor 126. The second terminal of transfer capacitor 126 is connected to low side power input 114 of low side driver 102. The second terminal of transfer capacitor 126 is also connected to a low side terminal, for example, a collector terminal of low side transistor 104, in close proximity to the semiconductor material of low side transistor 104 so that any low side parasitic inductance 108 of low side interconnects are between low side power input 114 and ground node 110, not between the low side terminal of low side transistor 104 and low side power input 114. A cathode terminal of diode 127 is connected to node 128. Node 128 is connected to a first terminal of resistor 129. A second terminal of resistor 129 is connected to node 130. Node 130 is connected to a high side terminal of bootstrap transistor 131, which may be, for example, a metal oxide semiconductor field effect transistor (MOSFET). High side driver 101 provides output 132 to an input terminal of bootstrap transistor 131, which may be, for example, a gate terminal of bootstrap transistor 131. A low side terminal of bootstrap transistor 131 is connected to node 133. Node 133 is connected to a bootstrap input 139 of high side driver 101 and to a first terminal of bootstrap capacitor 134. A second terminal of bootstrap capacitor 134 is connected to a low side power input 140 of high side driver 101 at output terminal 117.

A high voltage power supply, for example, a +300V power supply is connected to node 109. Node 109 is connected to a first terminal of high side parasitic inductance 107. A second terminal of high side parasitic inductance 107 is connected to node 113. Node 113 is connected to a high side terminal of high side transistor 103 and to a cathode terminal of high side reverse biased diode 105. The high side terminal of high side transistor 103 may be, for example, a collector terminal of an IGBT. A low side terminal of high side transistor 103 is connected to an anode terminal of high side reverse biased diode 105 and to output terminal 117. The low side terminal of high side transistor 103 may be, for example, an emitter terminal of an IGBT.

Output terminal 117 is connected to a high side terminal of low side transistor 104 and to a cathode terminal of low side reverse biased diode 106. The high side terminal of low side transistor 104 may be, for example, a collector terminal of an IGBT. A low side terminal of low side transistor 104 is connected to an anode terminal of low side reverse biased diode 106 and to low side power input 114 of low side driver 114. Low side power input 114 of low side driver 102 is connected to a first terminal of low side parasitic inductance 108. A second terminal of low side parasitic inductance 108 is connected to ground node 110 and to a negative terminal of voltage source 118.

Voltage source 118 charges transfer capacitor 126 through resistor 124, which may have a value, for example, of 100Ω. The values of resistor 124 and transfer capacitor 126 can be selected to provide a resistance-capacitance (RC) time constant to allow a fast recharge of transfer capacitor 126 (e.g., in approximately 1 μs). Transfer capacitor 126 transfers its charge through diode 127, resistor 129, and bootstrap transistor 131 to charge bootstrap capacitor 134, which may have a value, for example, of 10 μF. Bootstrap capacitor 134 provides a bootstrap voltage to a bootstrap input of high side driver 101 at node 133. As both terminals of transfer capacitor 126 avoid a low impedance coupling to ground node 110, the high side terminal of bootstrap transistor 131 is protected from high voltage with respect to ground node 110. The first terminal of transfer capacitor 126 at node 125 is protected from a low impedance coupling to ground node 110 by resistor 124. The second terminal of transfer capacitor 126 at low side power input 114 of low side driver 102 is protected from a low impedance coupling to ground node 110 by parasitic inductance 108. The input terminal and the low side terminal of bootstrap transistor 131 are also protected from a low impedance coupling to ground node 110 by parasitic inductance 108. Thus, voltages across the terminals of bootstrap transistor 131 do not reach high voltages. Accordingly, a simple, low voltage transistor can be used to provide high performance as bootstrap transistor 131 in circuit 100.

By providing a transfer capacitor referenced to a point in the circuit where high voltage transients will not result, wherein the transfer capacitor is used to charge a bootstrap capacitor, the drive of the external n-channel metal oxide semiconductor (NMOS) transistor used to recharge the bootstrap capacitor is improved, allowing use of a low voltage transistor instead of requiring a high voltage (e.g., 200V to 300V) transistor. Appropriate low impedance metal oxide semiconductor (MOS) transistors are more readily available as lower voltage transistors. Thus, a low cost bootstrap topology is provided to supply a high efficiency system.

A transfer capacitor 126 is disposed between a voltage source 118 and a bootstrap capacitor 134. The coupling (e.g., via resistor 124) between the voltage source 118 and the transfer capacitor 126 has a sufficiently high impedance to effectively decouple the transfer capacitor 126 from the voltage source 118 during any voltage transient events, allowing the transfer capacitor 126 to be referenced to a voltage other than the voltage source 118 during the voltage transient events. This topology allows to use a low voltage (instead of high voltage) bootstrap transistor 131 to control charging of the bootstrap capacitor 134 and to simplify control of operation of the bootstrap transistor 131.

The classic bootstrap topology has a source voltage (Vs) to supply the low side driver and a bootstrap capacitor (Cb) to supply the high side driver. The classic bootstrap topology is acceptable for low performance applications, such as where there is not much stray inductance or where the rate of change of current (dI/dt) is low (e.g., in a low efficiency system such as for a low cost application). An example of such a low performance system has a supply voltage $U_L=~5V$, a rate of change of current of ~200 A/μS, a loss of ~10%, and an efficiency of ~90%. The classic bootstrap topology has a source voltage (Vs) to supply the low side driver and bootstrap capacitor (Cb) to supply the high side driver.

By providing a transfer capacitor referenced to a different voltage than the source voltage (Vs), an improved bootstrap topology can be used to supply a high efficiency system (e.g., where a high rate of change of current (dI/dt) results in a high voltage across stray inductances, such as those that may be present between a low side (e.g., at low side power input 114) of a low side transistor 104 and the voltage to which it is connected). An example of such a high performance system has a supply voltage $U_L=~75V$, a high rate of change of current (dI/dt) of ~5 kA/μS, a loss of ~1%, and an efficiency of ~99%. A transfer capacitor 126 allows use of a low voltage bootstrap transistor 131 to recharge the bootstrap capacitor 134 of the high side driver 101 and to simplify the drive of this bootstrap transistor 131.

As rapid switching improves efficiency, a high efficiency system has a high rate of change of voltage (dv/dt) and a high rate of change of current (dI/dt). The high di/dt creates a voltage across the stray inductance (e.g., parasitic inductance 108) of the IGBT module (Lc, Le). Due to this inductive voltage spike, the emitter terminal of the low side transistor 104, at low side power input 114, has a peak of about ±150V, for example. But the floating ground of the high side driver 101, at output terminal 117, goes down to −150V, for example, compared to the +35V source voltage at voltage source 118. To be able to recharge 4 μC in 1 μs requires a 4 A peak current. So the +35V source voltage and the driver is supplied at 30V. A 1 Ω on-resistance (Rdson) will provide this 4A peak current.

A transfer capacitor 126 for a bootstrap circuit for high side driver 101 supplies current to a bootstrap capacitor 134 via a bootstrap transistor 131. The drain terminal of bootstrap transistor 131 is referenced to low side power input 114 of low side driver 102, which follows the output voltage at output terminal 117. Thus, the drain terminal of bootstrap transistor 131 at node 133 follows the output voltage at output terminal 117 when that output experiences a large negative voltage pulse.

By utilizing a charge transfer circuit including resistor 124, transfer capacitor 126, and diode 127 as an additional stage between the voltage source 118, which is referenced to ground node 110, and the bootstrap capacitor 134 of the high side driver 101, the voltage at the source of bootstrap transistor 131 can be controlled to within desirable limits such that a bootstrap transistor 131 of a lower voltage rating may be used. Transfer capacitor 126 is charged through resistor 124, which may, for example, be a 100Ω resistor, but transfer capacitor 126 is connected to, and therefore referenced to, the emitter voltage of low side transistor 104 at low side power input 114. So, as the floating ground of the high side driver, at output terminal 117, will follow the voltage of low side power input 114 when that voltage goes, for example, to −150V, bootstrap transistor 131 does not need to have a high drain-source breakdown voltage (BVds). Moreover, the critical limitations on the timing of bootstrap transistor 131 no longer apply, and bootstrap transistor 131 can be turned on at any time without harm. As resistor 124 lies between node 119, referenced to DC voltage source 118 and therefore referenced to ground node 110, and the first terminal of transfer capacitor 126 at node 125, the negative high voltage pulse that occurs as a result of switching will be applied across the transfer resistor 124 instead across the drain terminal and source terminal of bootstrap transistor 131.

As viewed from the high side driver 101, the voltage source 118 referenced to the ground node 110 is not used directly to charge bootstrap capacitor 134. Rather, a transfer voltage stored in transfer capacitor 126, which is referenced to a low side (e.g., an emitter terminal) of a low side transistor 104 at low side power input 114, is charged from voltage source 118 via resistor 124 and is used to charge bootstrap capacitor 134. As the voltage at the low side power input 114 is almost equal to the output voltage at output terminal 117, to which the drain of bootstrap transistor 131 is referenced, during the high voltage negative pulses, no high voltage difference exists across the terminals of bootstrap transistor 131. Thus, resistor 124 and transfer capacitor 126 provide a voltage isolation circuit to protect bootstrap transistor 131 from the high voltage negative pulses.

Figure 2:
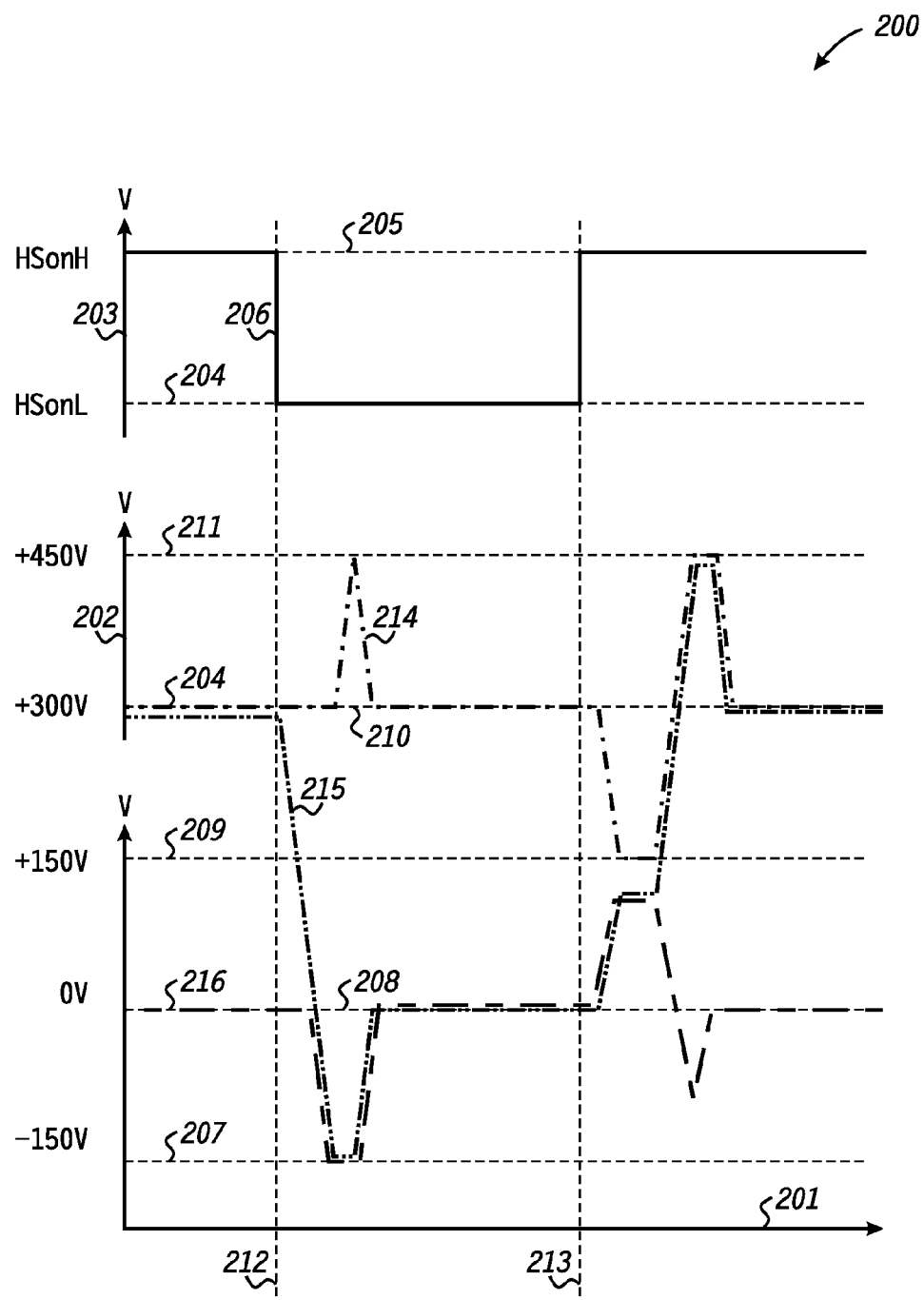
FIG. 2 is a graph illustrating voltages over time of several signals in relation to at least one embodiment.

FIG. 2 is a graph illustrating voltages over time of several signals in relation to at least one embodiment. Graph 200 shows a collector voltage signal 214, an output voltage signal 215, and an emitter voltage signal 216 with respect to a horizontal time axis 201 and a vertical voltage axis 202. Such signals are shown with respect to a high side transistor drive signal 206. The high side transistor drive signal 206 is shown with respect to horizontal time axis 201 and vertical voltage axis 203. The collector voltage signal 214 depicts a voltage at a collector terminal of bootstrap transistor 131. The emitter voltage signal 216 depicts a voltage at an emitter terminal of bootstrap transistor 131.

At an initial time depicted by vertical voltage axes 202 and 203, high side transistor drive signal 206 is at high level 205, collector voltage signal 214 is at the +300V supply voltage 210, output voltage signal 215 is at the +300V supply voltage 210, and emitter voltage signal 216 is at a 0V voltage 208. When high side transistor drive signal 206 changes to low level 204 at time 212, output voltage signal 215 begins to fall. When output voltage signal 215 reaches the 0V voltage 208, emitter voltage signal 216 begins to fall with output voltage signal 215 until both output voltage signal 215 and emitter voltage signal 216 reach −150V voltage 207. As output voltage signal 215 and emitter voltage signal 216 are falling, collector voltage signal 214 rises to +450V voltage 211, then falls back to +300V supply voltage 210. From −150V voltage 207, output voltage signal 215 and emitter voltage signal 216 rise to 0V voltage 208. While high side transistor drive signal 206 remains at low level 204, collector voltage signal 214 remains at +300V supply voltage 210, and output voltage signal 215 and emitter voltage signal 216 remain at 0V voltage 208.

At time 213, high side transistor drive signal 206 rises to high level 205. Then, collector voltage signal 214 falls to +150V voltage 209, and output voltage signal 215 and emitter voltage signal 216 rise to nearly +150V voltage 209. After a brief time, collector voltage signal 214 and output voltage signal 215 rise to +450V voltage 211, while emitter voltage signal 216 falls to approximately half way between 0V voltage 208 and −150V voltage 207, then rises to 0V voltage 208. Collector voltage signal 214 and output voltage signal 215 fall from +450V voltage 211 to +300V supply voltage 210. While high side transistor drive signal 206 remains at high level 205, collector voltage signal 214 and output voltage signal 215 remain at +300V supply voltage 210, and emitter voltage signal 216 remains at 0V voltage 208.

Figure 3:
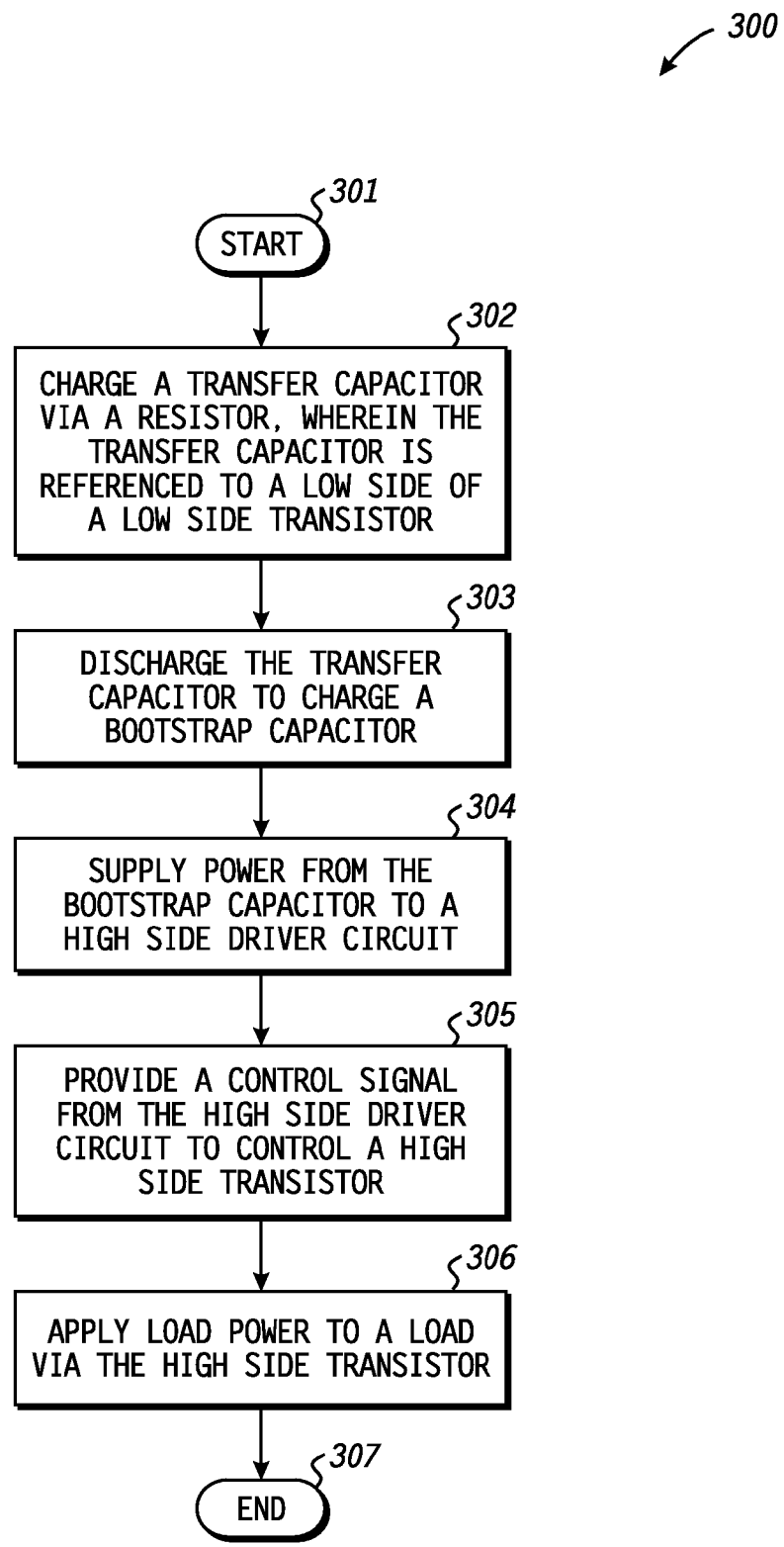
FIG. 3 is a flow diagram illustrating a method in accordance with at least one embodiment.

FIG. 3 is a flow diagram illustrating a method in accordance with at least one embodiment. The method 300 begins in block 301. From block 301, the method 300 continues to block 302. At block 302, a transfer capacitor is charged. The transfer capacitor is charged via a resistor. The transfer capacitor is referenced to a low side of a low side transistor. From block 302, the method 300 continues to block 303. At block 303, the transfer capacitor is discharged to charge a bootstrap capacitor. From block 303, the method 300 continues to block 304. At block 304, power from the bootstrap capacitor is supplied to a high side driver circuit. From block 304, the method 300 continues to block 305. At block 305, a control signal is provided from the high side driver circuit to a high side transistor. From block 305, the method 300 continues to block 306. At block 306, load power is applied to a load via the high side transistor. From block 306, the method 300 continues to block 307, where the method 300 ends.

In accordance with at least one embodiment, a circuit includes a high side driver for driving a high side transistor to couple a load output to a supply voltage, a bootstrap capacitor coupled to a bootstrap input of the high side driver, and a transfer capacitor coupled to the bootstrap capacitor to charge the bootstrap capacitor. The circuit can also include a low side transistor coupled to the load output, and a low side driver coupled to the low side transistor for driving the low side transistor, wherein the transfer capacitor is referenced to a low side of the low side transistor. The circuit can also include a resistor coupled to the transfer capacitor, wherein the transfer capacitor is to be charged from a voltage source via the resistor. The circuit can also include a nonlinear device coupled to the bootstrap capacitor and to the transfer capacitor, wherein the transfer capacitor charges the bootstrap capacitor through the nonlinear device. The nonlinear device can be, as an example, a diode. The nonlinear device can be, as another example, a transistor. The transfer capacitor and a resistor supplying current to the transfer capacitor can protect against the application of a high voltage across the nonlinear device.

In accordance with at least one embodiment, a method includes charging a transfer capacitor, discharging the transfer capacitor to charge a bootstrap capacitor, supplying power from the bootstrap capacitor to a high side driver circuit, providing a control signal from the high side driver circuit to a high side transistor, and applying load power to a load via the high side transistor. The transfer capacitor can be referenced to a low side of a low side transistor. The transfer capacitor can be charged via a resistor. The discharging the transfer capacitor to charge the bootstrap capacitor can be performed via a nonlinear device coupled to the bootstrap capacitor and to the transfer capacitor. The nonlinear device can be, as an example, a diode. The nonlinear device can be, as another example, a transistor. The transfer capacitor and a resistor supplying current to the transfer capacitor can protect against the application of a high voltage across the nonlinear device.

In accordance with at least one embodiment, an integrated circuit includes a high side driver for driving a high side transistor to couple a load output to a supply voltage, a bootstrap capacitor coupled to a bootstrap input of the high side driver, and a transfer capacitor coupled to the bootstrap capacitor to charge the bootstrap capacitor. The integrated circuit can further include a low side driver for driving a low side transistor, wherein the transfer capacitor is referenced to a low side of the low side driver. The integrated circuit can further include a resistor coupled to the transfer capacitor, wherein the transfer capacitor is charged from a voltage source via the resistor. The integrated circuit can further include a nonlinear device coupled to the bootstrap capacitor and to the transfer capacitor, wherein the transfer capacitor charges the bootstrap capacitor through the nonlinear device. The nonlinear device can be, as an example, a diode. The nonlinear device can be, as another example, a transistor.

Accordingly, an IGBT gate driver for use in a high efficiency (e.g., 99% efficiency) system can be implemented using a low cost improved bootstrap topology. Such a driver can be usefully employed in a variety of power applications, for example, automotive electronics, power control devices, and electrically commutated motors.

While terms such as resistor, capacitor, and inductor are used herein, it should be understood that such terms are intended to include not only actual resistors, capacitors, and inductors, but also any other device that provides the desired resistance, capacitance, or inductance.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A circuit comprising:
a high side driver for driving a high side transistor to couple a load output to a supply voltage;
a bootstrap capacitor coupled to a bootstrap input of the high side driver;
a transfer capacitor coupled to the bootstrap capacitor to charge the bootstrap capacitor, the transfer capacitor having a first transfer capacitor terminal and a second transfer capacitor terminal, the second transfer capacitor terminal directly connected to a low side power input of a low side driver;
a first resistor coupled to the first transfer capacitor terminal, the transfer capacitor configured to be charged from a voltage source through the first resistor, wherein the first resistor is configured to effectively decoupled the transfer capacitor from the voltage source during a voltage transient event; and
a second resistor through which the transfer capacitor is configured to charge the boot capacitor.

2. The circuit of claim 1 further comprising:
a low side transistor coupled to the load output, wherein the low side driver is coupled to the low side transistor for driving the low side transistor, wherein the transfer capacitor is connected to a low side terminal of the low side transistor.

3. The circuit of claim 1 further comprising:
a nonlinear device coupled to the bootstrap capacitor and to the transfer capacitor, wherein the transfer capacitor charges the bootstrap capacitor through the nonlinear device.

4. The circuit of claim 3 wherein the nonlinear device is a diode.

5. The circuit of claim 3 wherein the nonlinear device is a transistor.

6. The circuit of claim 3 wherein the transfer capacitor and the first resistor supplying current to the transfer capacitor protect against the application of a high voltage across the nonlinear device.

7. A method comprising:
charging a transfer capacitor, the transfer capacitor having a first transfer capacitor terminal and a second transfer capacitor terminal, the second transfer capacitor terminal directly connected to a low side power input of a low side driver;
discharging the transfer capacitor to charge a bootstrap capacitor, wherein the discharging the transfer capacitor to charge the bootstrap capacitor is performed via a nonlinear device coupled to the bootstrap capacitor and to the transfer capacitor, wherein the nonlinear device is a transistor;
supplying power from the bootstrap capacitor to a high side driver circuit;
providing a control signal from the high side driver circuit to a high side transistor; and
applying load power to a load via the high side transistor.

8. The method of claim 7 wherein the transfer capacitor is connected to a low side terminal of a low side transistor.

9. The method of claim 7 wherein a first resistor is coupled to the transfer capacitor terminal, the transfer capacitor configured to be charged from a voltage source through the first resistor, wherein the first resistor is configured to effectively decoupled the transfer capacitor from the voltage source during a voltage transient event.

10. The method of claim 7 wherein the transfer capacitor and a resistor supplying current to the transfer capacitor protect against the application of a high voltage across the nonlinear device.

* * * * *